(12) United States Patent
Raiteri

(10) Patent No.: US 6,371,898 B1
(45) Date of Patent: Apr. 16, 2002

(54) TOOL-CHANGE SYSTEM FOR A MACHINE TOOL WITH A NUMBER OF MACHINING HEADS

(75) Inventor: Angelo Raiteri, Ivrea (IT)

(73) Assignee: Pluritec Italia S.p.A., Borgomanero (IT)

( * ) Notice: Subject to any disclaimer, the term of this patent is extended or adjusted under 35 U.S.C. 154(b) by 0 days.

(21) Appl. No.: 09/567,953

(22) Filed: May 9, 2000

Related U.S. Application Data

(63) Continuation of application No. 09/162,642, filed on Sep. 29, 1998, now Pat. No. 6,102,839.

(30) Foreign Application Priority Data

Oct. 2, 1997 (IT) ......................................... TO97A0870

(51) Int. Cl.[7] .............................................. B23Q 3/157
(52) U.S. Cl. .............................. 483/1; 483/51; 483/52; 483/63; 483/64
(58) Field of Search ........................... 483/55, 54, 58, 483/30, 31, 44, 32, 43, 57, 51, 52, 1; 409/202, 212

(56) References Cited

U.S. PATENT DOCUMENTS

| 3,466,740 A | 9/1969 | Harman ........................ 29/568 |
| 3,571,912 A | 3/1971 | Kielma ......................... 29/568 |
| 4,516,311 A | * 5/1985 | Takakuwa ..................... 483/31 |
| 4,658,494 A | 4/1987 | Ohtani et al. .................. 29/568 |
| 4,675,977 A | 6/1987 | Kölblin et al. ................. 29/568 |
| 4,715,108 A | 12/1987 | Sugiyama et al. ............. 29/568 |
| 4,932,118 A | * 6/1990 | Winkler et al. ............ 483/68 X |
| 5,133,128 A | * 7/1992 | Katayama et al. ............. 483/44 |
| 5,230,685 A | * 7/1993 | Christen et al. ......... 409/202 X |
| 5,462,512 A | 10/1995 | Hiroshima et al. ............. 483/57 |
| 5,486,151 A | 1/1996 | Bergmann et al. ............. 483/1 |
| 5,882,286 A | 3/1999 | Aufiero ....................... 483/55 |

FOREIGN PATENT DOCUMENTS

| DE | 3022-717 | 6/1980 | ............ B23Q/3/15 |
| DE | 3414886 | 9/1985 | ............ B23B/39/04 |
| DE | 3644-024 A | 6/1988 | ............ B23Q/3/15 |
| DE | 29712034 | 9/1997 | ............ B23B/41/14 |
| EP | 0 332 531 | 9/1989 | ............ B23Q/3/157 |
| EP | 541020 | * 5/1993 | ................ 483/903 |
| GB | 2128909 | * 5/1984 | ................. 483/64 |
| JP | 59-161247 | * 9/1984 | ................. 483/64 |
| JP | 59-166437 | 9/1984 | ............ B23Q/3/155 |
| JP | 60-172437 | 9/1985 | ............ B23Q/3/157 |
| JP | 62-4543 | * 1/1987 | ................ 483/903 |
| JP | 2-124244 | 5/1990 | ............ B23Q/3/157 |
| JP | 05 329733 | 12/1993 | ............ B23Q/3/157 |
| JP | 6-304835 | * 11/1994 | ................. 483/40 |

* cited by examiner

*Primary Examiner*—William Briggs
(74) *Attorney, Agent, or Firm*—Sheridan Ross P.C.

(57) ABSTRACT

The tools of the various machining heads are housed on a common drum, which is remote from the heads and rotated to select a given row of tools. At each head, there is provided and intermediate station having a container housing a row of tools; and a shuttle provides for sequentially transferring the tools between the drum and the intermediate stations. Each container is rotated 90° between a position cooperating with the shuttle and a position cooperating with a device for exchanging the tools between the head and the container. The container is also movable with respect to the device to select the location of the tool to be changed.

6 Claims, 4 Drawing Sheets

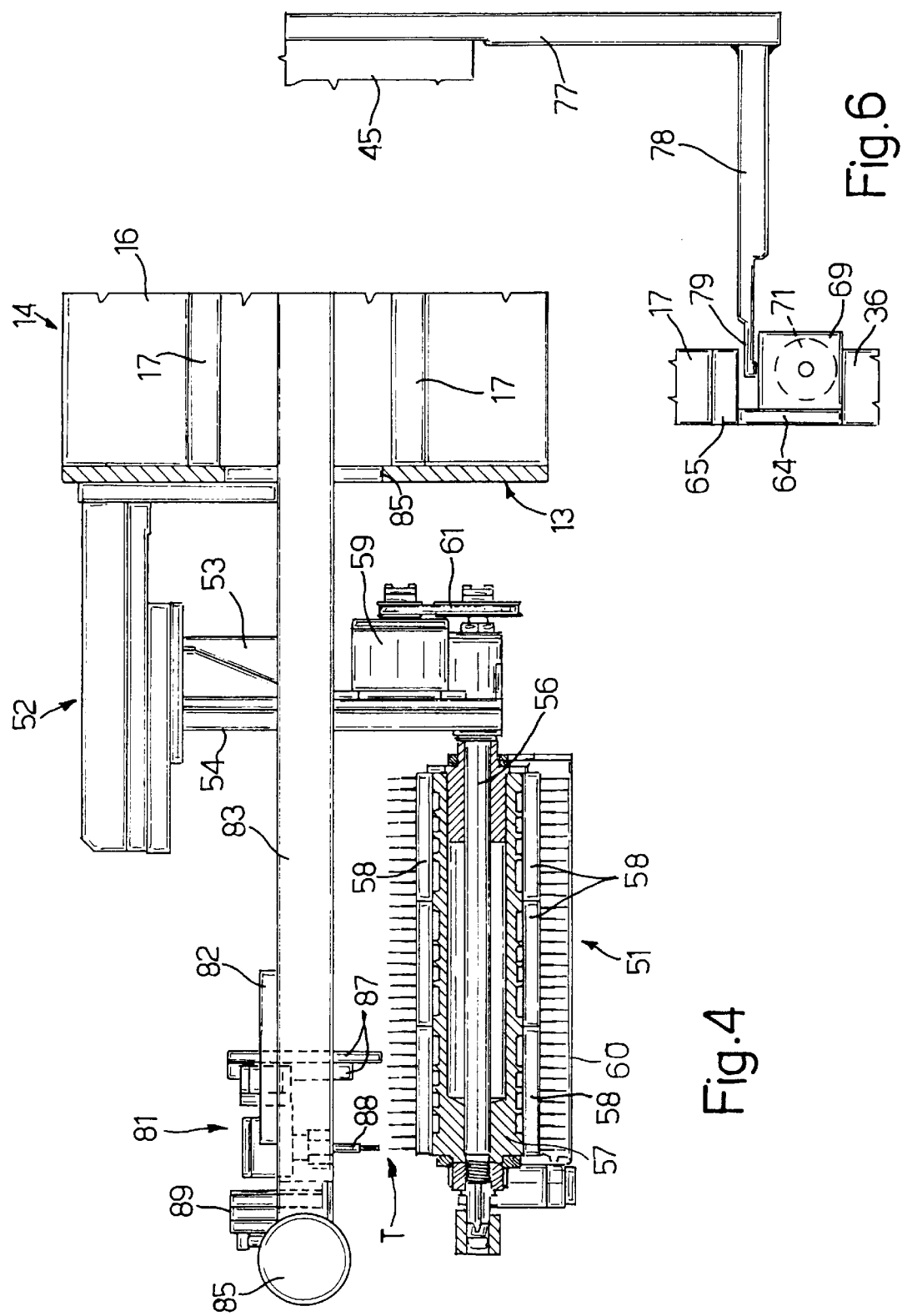

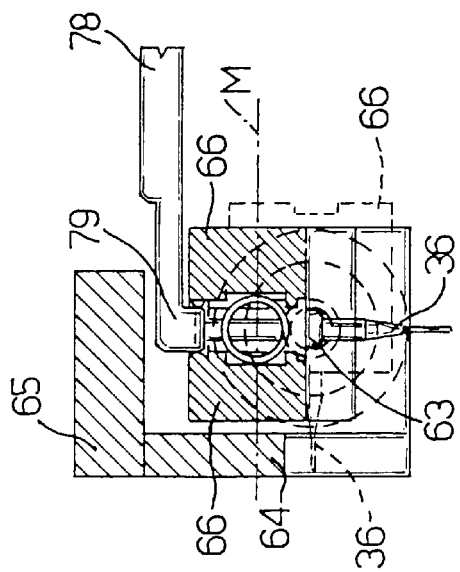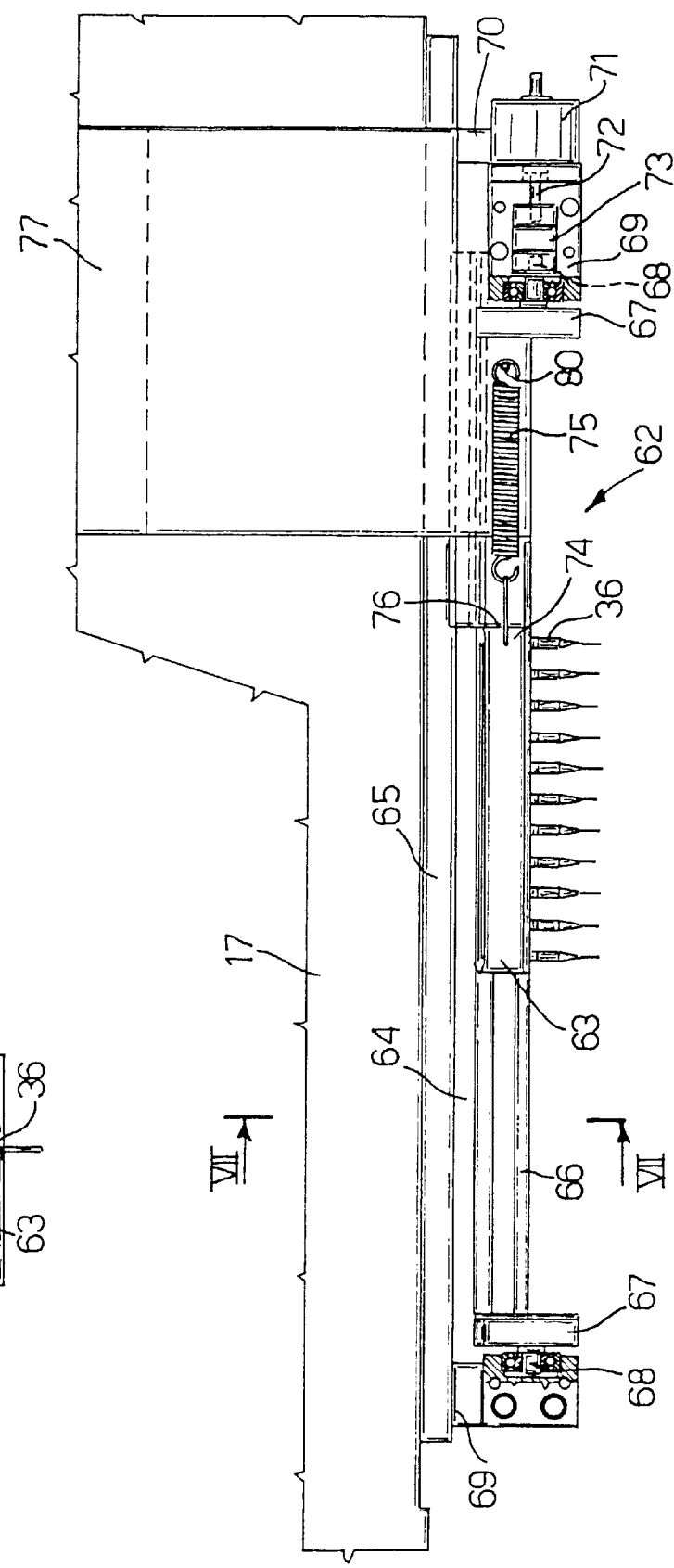

TOOL-CHANGE SYSTEM FOR A MACHINE TOOL WITH A NUMBER OF MACHINING HEADS

This patent is a continuation of U.S. patent application Ser. No. 09/162,642 filed on Sep. 29, 1998, now U.S. Pat. No. 6,102,839, which claims foreign priority benefits under 35 U.S.C. §119 from Italian Patent Application Serial No. TO97A000870 filed on Oct. 2, 1997.

BACKGROUND OF THE INVENTION

The present invention relates to a tool-change system for a machine tool with a number of machining heads, in particular for machining printed circuit boards.

Various tool-change systems are known for machine tools of the above type, each machining head of which normally has a respective tool store and a respective device for exchanging tools between the store and the head. In one known machine, the various stores are located on the machine bed, and the worktable carries a number of tool-change devices.

In another known machine, each head is provided with a drum supporting a number of rows of tools, and which rotates selectively on the machine bed to present the tool-change device with the row containing the required tool. In this case, too, the tool-change device is carried on the table.

The tool-change systems of the above known machines have several drawbacks. In particular, they call for a number of identical members for supporting and selecting the tools, thus increasing the cost of the machine. Moreover, they occupy considerable space on the machine bed, thus enormously increasing the size of the machine. And finally, to change the tool stores, the machine must be arrested, thus also increasing the running cost of the machine.

SUMMARY OF THE INVENTION

It is an object of the present invention to provide a highly straightforward, reliable tool-change system for a machine tool with a number of machining heads, designed to eliminate the aforementioned drawbacks typically associated with known systems.

According to the present invention, there is provided a tool-change system for a machine tool with a number of machining heads, in particular for machining printed circuit boards; characterized in that the tools for said heads are housed in a common store, and are transferred selectively between said store and a group of intermediate stations; changing means being provided to change the used tool on each head with a tool transferred to one of said stations.

BRIEF DESCRIPTION OF THE DRAWINGS

A preferred, non-limiting embodiment of the invention will be described by way of example with reference to the accompanying drawings, in which:

FIG. 4 shows a partial section along line IV—IV in FIG. 2;

FIG. 5 shows a much larger-scale detail of FIG. 1;

FIG. 6 shows a left-side view of the FIG. 5 detail;

FIG. 7 shows a larger-scale section along line VII—VII in FIG. 5.

DETAILED DESCRIPTION OF THE INVENTION

Figure 1:
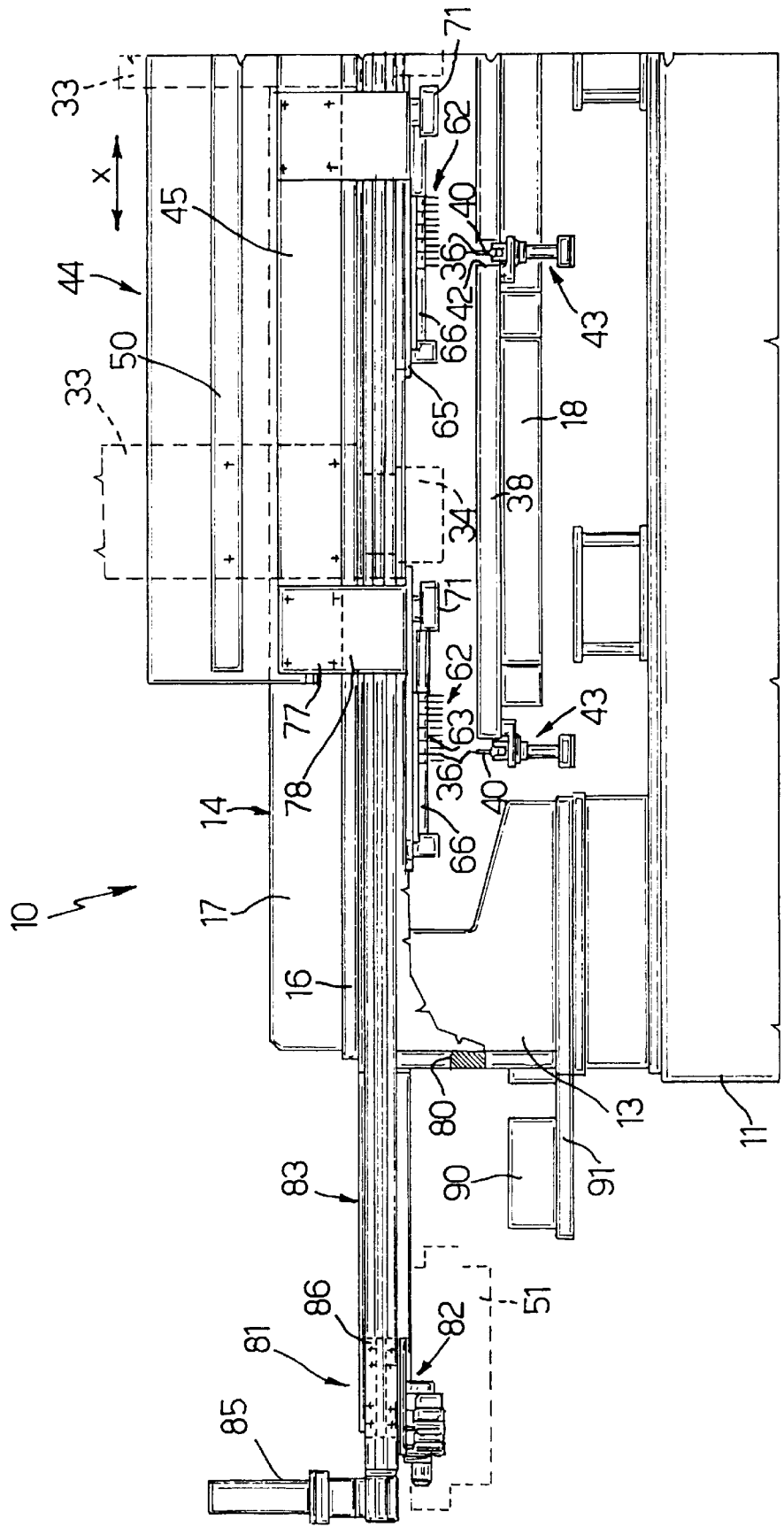
FIG. 1 shows a partial front view of a machine tool for machining printed circuit boards, and incorporating a tool-change system in accordance with the present invention.

Number 10 in FIG. 1 indicates as a whole a machine tool for machining printed circuit boards, and which comprises a bed 11 supporting two lateral uprights 13, only the left-hand one of which is shown in the drawings. Uprights 13 are fitted with a steel crosspiece 14 comprising a horizontal plate 16 and two vertical plates 17 (see also FIG. 2); and machine 10 also comprises a worktable 18 movable in known manner in a first direction hereinafter referred to as axis Y.

A carriage 44 travels along crosspiece 14 in a second direction hereinafter referred to as axis X, and comprises two parallel bars 46 connected to each other by a number of crosspieces 47. Each bar 46 is a steel box bar, and is reinforced by a pair of rectangular-section bars 45 and 50; each pair of bars 45, 50 is fitted with a respective row of machining heads 33, e.g. comprising four heads 33; each two corresponding heads in the two rows form a pair of heads 33, so that carriage 44 carries a total of eight heads 33; and each head 33 comprises a vertical tool-holder spindle 34 for receiving a tool 36, and which is moved along a vertical axis z by a reversible numeric-control electric motor (not shown).

Machining of the printed circuit boards mainly comprises drilling, but may also comprise milling operations. The boards are arranged in packs, each of which is placed for machining on a fixture 38 fitted to table 18 and associated with a respective head 33. Table 18 therefore carries eight fixtures 38 arranged in two rows, with a gap 42 between adjacent pairs of fixtures 38.

The first pair of fixtures 38 on the left is flanked by a first pair of devices 43 for changing tool 36, each device being associated with a respective head 33 in the corresponding pair; each of the spades 42 between pairs of fixtures 38 houses a respective pair of devices 43 associated with heads 33 in the next pair to the right; each device 43 is defined by a pneumatic gripper 40 for removing a tool 36, e.g. from spindle 34; and gripper 40 is moved along the Z axis in known manner by a corresponding pneumatic piston (not shown).

According to the invention, the system for changing tools 36 comprises a store 51 (indicated by a dash line in FIG. 1 for the sake of simplicity) which is common to tools 36 of all of heads 33 and is located outwards of crosspiece 14. More specifically, store 51 (FIGS. 2 and 4) is fitted to a support indicated as a whole by 52, and which in turn is fitted to the left-hand upright 13 and comprises a bracket 53 extending forwards and having a vertical wall 54 fitted with a rotary shaft 56 parallel to crosspiece 14.

Store 51 is defined by a drum 57 fittable removably to shaft 56 substantially as described in European Patent N. 541.020. More specifically, drum 57 houses a number of—e.g. twenty—rows of tools 36; each row is located in a predetermined angular position on drum 57, and may receive three clips or strips 58 of tools 36, so that store 51 has a capacity for an extremely large number of tools 36.

Each strip 58, in itself known, is defined by a body made of plastic material and having a number of locations or seats for tools 36, e.g. of the collarless type. Each tool 36 is retained frictionally inside the respective seat by elastic elements on the body of strip 58, and is withdrawn from and inserted inside the seat axially. Drum 57 also comprises a guard 60 for tools 36.

Wall 54 of bracket 53 is also fitted with an electric step motor 59, which, by means of a belt-61, rotates drum 57 to move the required row of tools 36 into a transfer position T, in which tools 36 are positioned horizontally with the tips facing the rear of machine 10. To select the row of tools 36, store 51 is therefore moved in a plane perpendicular to crosspiece 14.

At each pair of machining heads 33 on carriage 44, an intermediate station 62 (FIG. 1) is provided for temporarily housing the new tools 36 to be fitted to spindle 34 of head 33, and the used tools 36 extracted from spindle 34 by tool-change device 43. Each intermediate station 62 comprises a container 63 (FIGS. 5 and 6) for housing a predetermined number of tools 36 in a row parallel to crosspiece 14. Container 63 is defined by a body similar to that of strips 58 on drum 57 but normally with no tools 36, and is fitted to a support 64 integral with a plate 65 fitted underneath crosspiece 14.

More specifically, support 64 comprises a guide defined by two prismatic bars 66 (FIG. 7) parallel to crosspiece 14 and between which container 63 is housed in sliding manner. Bars 66 have a median plane M perpendicular to the axes of tools 36, and are connected to each other by two sides 67, each having a pin 68. Support 64 comprises two sides 69 to which the two pins 68 are fitted in rotary manner; and, in the FIG. 7 position, the axis of pins 68 is below the median plane M of bars 66.

An appendix 70 of support 64 is fitted with a pneumatic motor 71 having a shaft 72, which is rotated between two positions at 90° to each other, and is connected by a joint 73 to the adjacent pin 68, so that bars 66 are rotated 90° together with container 63. Bars 66 are normally so positioned by motor 71 that container 63 positions tools 36 horizontally and aligned with the row of tools 36 on drum 57 in transfer position T. When rotated 90°, motor 71, by means of bars 66, moves container 63 into a vertical tool-change position, with the tips of the tools facing downwards as shown in FIGS. 5 and 7.

A spring 75 is fitted between a pin 80 on support 64 and one end 74 of container 63, and provides for normally holding container 63 against a stop 76 fitted to bars 66. The front rectangular-section bar 45 of carriage 44 (FIGS. 1 and 6) is fitted, to the left of respective head 33, with a plate 77 supporting an arm 78, which has an appendix 79 for engaging end 74 of container 63.

When container 63 is rotated into the tool-change position, appendix 79 draws container 63 parallel to crosspiece 14, in opposition to spring 75, to select each time the location of tool 36 to be changed. Conversely, when container 63 is set with tools 36 positioned horizontally, appendix 79, by virtue of the position of pins 68, fails to encounter bars 66 and therefore travels freely.

The system for changing tools 36 also comprises a transfer device indicated as a whole by 81 and which is common to all of intermediate stations 62 and provides for selectively transferring tools 36 between store 51 and intermediate stations 62, which are served sequentially. Device 81 comprises a shuttle 82 fitted to a known linear actuator 83, which extends rightwards substantially the whole length of crosspiece 14, and which, leftwards, extends through an opening 80 in upright 13 and beyond drum 57.

More specifically, actuator 83 is fitted to crosspiece 14 by supporting means comprising an arm 92 (FIGS. 2 and 3) extending outwards of the left-hand upright 13, and comprises a toothed belt 84 cooperating with vertical-axis pulleys, one of which is rotated selectively by an electric motor 85. Shuttle 82 comprises a slide 86 fitted to the front portion of belt 84 and supporting a horizontal guide 87 perpendicular to the axis of drum 57 to guide a gripper 88 for gripping a tool 36.

Figure 2:
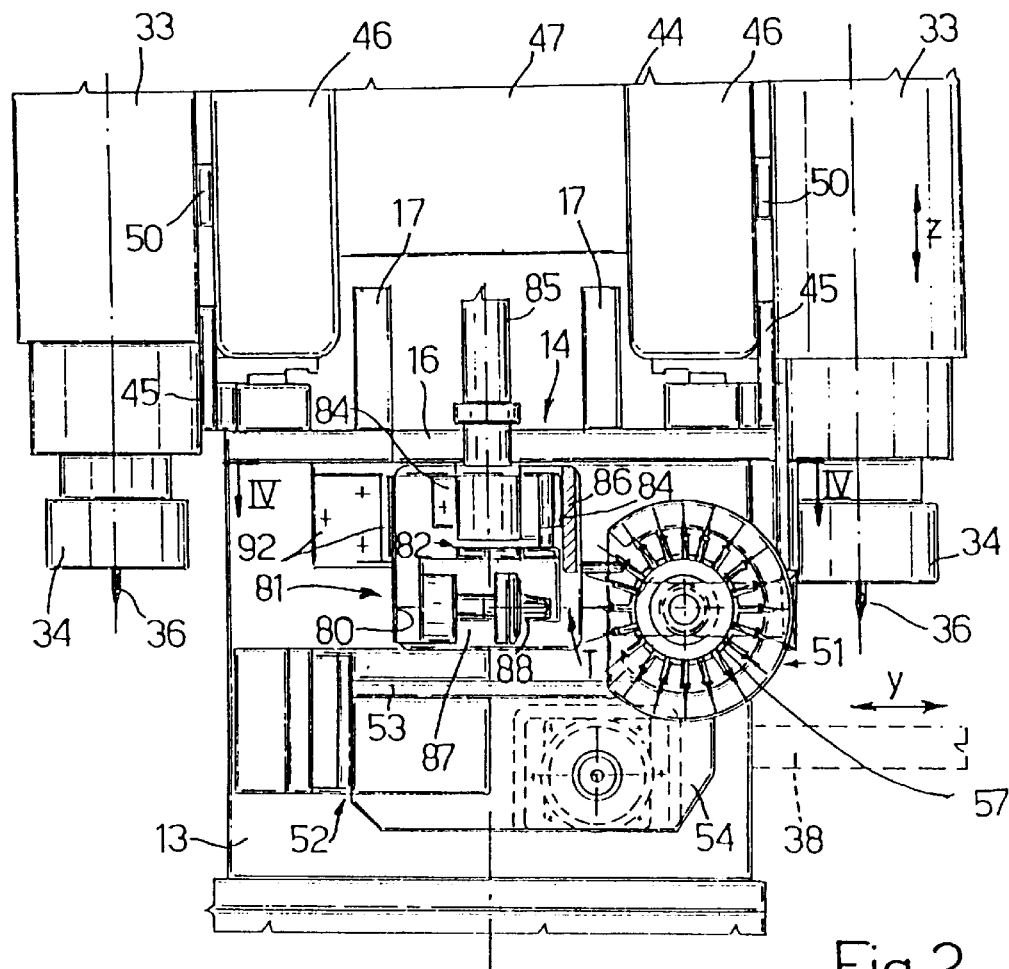
FIG. 2 shows a partial larger-scale side view of the FIG. 1 machine.
Figure 3:
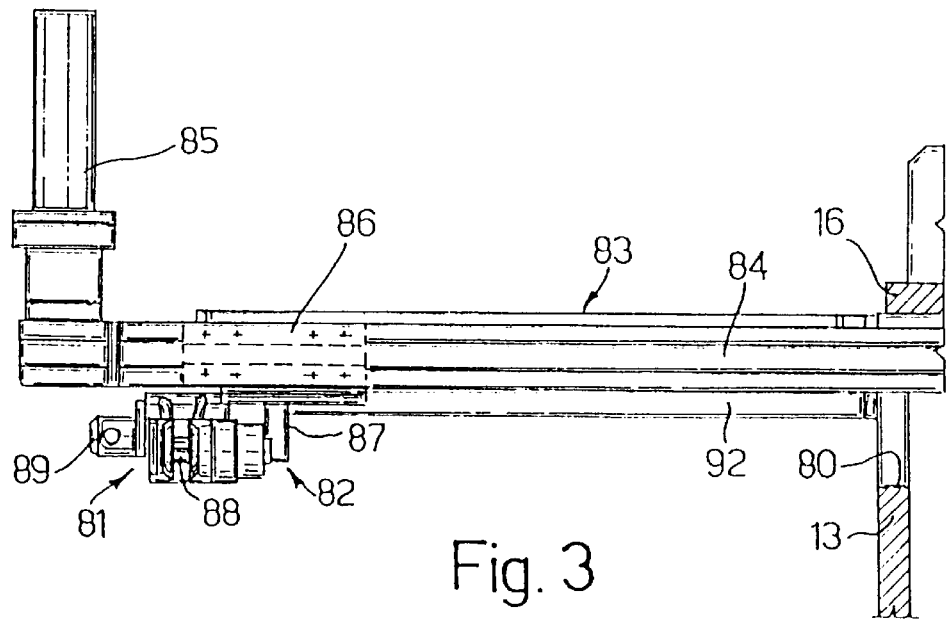
FIG. 3 shows a larger-scale detail of FIG. 1.

Gripper 88 is substantially similar to grippers 40 for changing tools 36, is oriented with two movable jaws in a vertical plane, and is moved along guide 87 by a pneumatic cylinder 89 (FIG. 4) not shown in FIG. 2. The left-hand upright 13 is also fitted with a support 91 fitted removably with a container 90 for discarded tools 36; and each spindle 34 comprises a known tool-condition sensor (not shown) for indicating to a control unit when the respective tool 36 is no longer serviceable due to damage or wear.

The system for changing tools 36 operates as follows.

To begin with, it is assumed drum 57 (FIG. 4) with tools 36 is fitted to shaft 56; each of spindles 34 is fitted with a tool 36; some already-used tools 36 are housed inside containers 63 (FIG. 5); and containers 63 are set by motor 71 to the angular position shown by the dash line in FIG. 7 and in which the tools are positioned horizontally.

It is also assumed the packs of printed circuit boards for machining are fitted onto fixtures 38 (FIG. 1); machine 10 is performing the set drilling and milling cycles using the tools 36 in spindles 34; and, at each cycle, the control unit positions table 18 along axis Y and carriage 44 along axis X, and then activates spindles 34 of heads 33 to simultaneously machine the packs of printed circuit boards.

In the course of the above machining cycles, the control unit operates transfer device 81 to perform a series of transfer cycles of tools 36 between drum 57 (FIG. 4) and intermediate stations 62. At each cycle, the transfer of a new tool 36 from drum 57 to intermediate station 62 alternates with the return of a used tool 36 from station 62 to drum 57.

To begin with, drum 57 (FIG. 2) is rotated to position the row containing the tool/s 36 to be withdrawn into transfer position T, if the row is not already in the transfer position. At the same time, actuator 83 is operated to position shuttle 82, together with gripper 88, opposite the tool 36 to be transferred. Pneumatic cylinder 89 (FIG. 4) is then operated so that gripper 88 engages tool 36; gripper 88 is closed; and cylinder 89 is again operated to extract tool 36 from drum 57.

Actuator 83 is then operated to position shuttle 82, together with gripper 88, opposite the location in container 63 (FIGS. 1 and 7) associated with the first pair of machining heads 33, into which the new tool 36 is to be inserted; cylinder 89 (FIG. 4) is again operated so that gripper 88 inserts the new tool 36 inside the selected location; and gripper 88 is then opened and moved by actuator 83 to the location in container 63 containing the tool 36 to be transferred to drum 57. Whenever possible, the control unit is so programmed that the location into which the new tool 36 is inserted is adjacent to that from which the used tool 36 is withdrawn.

Once gripper 88 is closed, actuator 83 is operated to position shuttle 82, together with gripper 88, opposite the location in the row on drum 57 into which the used tool 36 is to be inserted. Operating gripper 88 in the same way as before to insert tool 36 inside container 63, the used tool 36 is then inserted inside the respective strip 58 on the drum.

If a given used tool 36 has been memorized by the control unit as being no longer serviceable, the control unit arrests actuator 83 and shuttle 82 at container 90 (FIG. 1) during the transfer cycle to drum 57, and gripper 88 is opened to drop the discarded tool 36 into container 90. The above transfer cycle is repeated sequentially for all of intermediate stations 62, and may also be repeated to transfer more than one tool 36 to each station 62 and so form a standby stock of tools 36 in containers 63.

To change tools 36 in spindles 34, operation of transfer device 81 is suspended temporarily. To begin with, the control unit operates pneumatic motors 71 (FIGS. 5 and 7) to rotate bars 66, together with containers 63, to position tools 36 vertically; the control unit then moves carriage 44 (FIGS. 1 and 2) and table 18 along respective axes X and Y to align the axes of spindles 34 with grippers 40 for changing tools 36; and grippers 40 are then activated by the pneumatic cylinders to withdraw the respective used tools 36 from spindles 34.

The control unit then moves carriage 44 selectively leftwards so that appendixes 79 (FIGS. 5 and 6) of arms 78 engage ends 74 of respective containers 63; each container 63 is drawn in opposition to spring 75 to align the location in container 63 into which the used tool 36 is to be inserted with the gripper 40 (FIG. 1) relative to the front machining head 33 in each pair; and gripper 40 then inserts the used tool 36 inside container 63. The above operation is repeated to insert into containers 63 the tools 36 extracted by grippers 40 relative to the machining heads 33 in the rear row.

Two successive operations, similar to those described above, are then performed, whereby appendixes 79 position containers 63 to withdraw the new tools 36 first by grippers 40 of the, front row of heads 33, and then by grippers 40 of the rear row of heads 33. Once carriage 44 and table 18 are repositioned, grippers 40 are operated simultaneously to insert the new tools 36 inside respective spindles 34 and so recommence machining the packs of printed circuit boards and transferring tools 36 between common store 51 and intermediate stations 62.

Drum 57 of tools 36 may be changed by the operator even while the packs of printed circuit boards are being machined, by simply temporarily suspending transfer of tools 36 by device 81. By virtue of each container 63 containing a number of tools 36, machine 10, during replacement of drum 57, may not only continue working with the tools 36 already inserted inside spindles 34, but may also perform several tool-change cycles between spindles 34 and containers 63.

As compared with known systems, the advantages of the tool-change system according to the invention will be clear from the foregoing description. In particular, common store 51 provides for simplifying the structure of machine 10. Moreover, machine 10 is far more compact by eliminating the individual stores of the various machining heads 33. And finally, using intermediate stations 62 for tools 36 and a remote common store 51 provides for eliminating the downtime incurred on known machine tools to change the stores, thus reducing the running cost of the machine.

Clearly, changes may be made to the system as described and illustrated herein without, however, departing from the scope of the accompanying claims. For example, drum 57 may be replaced by a drawer-type store moved in known manner in a direction perpendicular to crosspiece 14; machine 10 may comprise only one row of machining heads 33, possibly movable independently of one another along crosspiece 14; and machine 10 may comprise an intermediate station 62 for each head 33, even in the case of heads 33 arranged in two rows.

Each device 43 for changing tools 36 may provide for serving at least two machining heads 33; container 63 may be fitted to support 64 for troublefree replacement by hand; and intermediate station 62 may comprise any number of locations, greater than two, for tools 36, and may be moved with respect to tool-change grippers 40 by any type of actuator independent of the movement of carriage 44.

What is claimed is:

1. A tool-change system for a machine tool with a plurality of machining heads for machining printed circuit boards, comprising:

a machine tool printed circuit carrying table;

a common guiding crosspiece for movably mounting said machining heads within a working space of said table;

a number of tools to be used by said machining heads;

a common store for said tools, wherein said store is interconnected to said machine tool outside said working space, said store being adapted to be accessed by the operator while said machining heads are operating;

a common transfer device for transferring said tools;

a plurality of tool changing means associated to said machining heads, and a control unit for controlling said common transfer device and said plurality of tool changing means; and a group of intermediate stations interconnected to said machine tool, wherein said control unit causes said transfer device to transfer said tools selectively between said common store and said group of intermediate stations as to serve said intermediate stations sequentially, and causes said changing means to replace a used tool on each machining head with a tool transferred to one of said stations, independently of said transfer means.

2. A system as claimed in claim 1, wherein each of said stations is provided with two or more locations housing corresponding tools, means being provided in each of said stations to select each time the location of the tool to be changed.

3. A system as claimed in claim 2, wherein said heads are interconnected to a common carriage movable along said common guiding cross piece, said stations being arrayed along at least one line that is parallel to said cross piece.

4. A method for changing tools on a machine tool having multiple machining heads, comprising:

providing a machine tool having a plurality of machining heads coupled to a carriage movable within a working space;

transferring tools from a store located outside said working space sequentially to a plurality of intermediate stations with a first common device, each intermediate station being provided with two or more tool locations; and transferring one tool at a time from each one of said intermediate stations to said machining heads with a plurality of second devices associated with said machining heads, said second devices operating independently of said first common device.

5. A machine tool for machining printed circuit boards, having a tool-change system comprising:

a plurality of machining heads movable along a common crosspiece within a working space;

a plurality of tools for said machining heads;

a common store for said tools, said store being interconnected to said machine tool;

a group of intermediate stations interconnected to said machine tool outside said working space and arrayed along at least one line parallel to said crosspiece, each one of said stations having a plurality of positions each one for housing a tool;

a plurality of tool changing means to replace a used tool on each head with a tool housed in a selected position of one of said stations;

a common transfer device for transferring said tools between said store and said intermediate stations, said transfer device including reciprocating means adapted to grip one tool at a time and to transfer same to another selected position of one of said stations; and a control unit for causing said reciprocating means to serve said stations sequentially.

6. A machine tool having an automated tool changing system, comprising:

a number of tools;

a movable carriage;

a remote store for said tools;

a plurality of machining heads coupled to said carriage;

a plurality of intermediate stations associated to said machining heads, each one of said intermediate stations including two or more positions for housing corresponding tools;

a shuttle for transferring said tools between said store and said intermediate stations; a control unit for controlling said shuttle to transfer said tools to said intermediate stations sequentially; and a plurality of grippers controlled by said control unit for changing said tools between said machining heads and a selected position of said intermediate stations independently of said shuttle.

* * * * *